United States Patent
Kawahara et al.

(10) Patent No.: US 11,953,822 B2
(45) Date of Patent: Apr. 9, 2024

(54) REFLECTIVE MASK BLANK FOR EUV LITHOGRAPHY, REFLECTIVE MASK FOR EUV LITHOGRAPHY, AND METHOD FOR MANUFACTURING SAME

(71) Applicant: AGC INC., Tokyo (JP)

(72) Inventors: Hirotomo Kawahara, Tokyo (JP); Daijiro Akagi, Tokyo (JP); Hiroaki Iwaoka, Tokyo (JP); Toshiyuki Uno, Tokyo (JP); Michinori Suehara, Tokyo (JP); Keishi Tsukiyama, Tokyo (JP)

(73) Assignee: AGC INC., Tokyo (JP)

( * ) Notice: Subject to any disclaimer, the term of this patent is extended or adjusted under 35 U.S.C. 154(b) by 0 days.

(21) Appl. No.: 18/198,881

(22) Filed: May 18, 2023

(65) Prior Publication Data

US 2023/0324785 A1  Oct. 12, 2023

Related U.S. Application Data

(63) Continuation of application No. PCT/JP2022/005224, filed on Feb. 9, 2022.

(30) Foreign Application Priority Data

Feb. 16, 2021 (JP) ................. 2021-022583

(51) Int. Cl.
*G03F 1/32* (2012.01)
*G03F 1/24* (2012.01)
*G03F 1/48* (2012.01)

(52) U.S. Cl.
CPC ............. *G03F 1/32* (2013.01); *G03F 1/24* (2013.01); *G03F 1/48* (2013.01)

(58) Field of Classification Search
CPC ................ G03F 1/24; G03F 1/32; G03F 1/48
USPC ............................................. 430/5
See application file for complete search history.

(56) References Cited

U.S. PATENT DOCUMENTS 6,352,803 B1   3/2002  Tong et al.
2022/0035234 A1*  2/2022  Akagi ................ H01L 21/0337

FOREIGN PATENT DOCUMENTS

| JP | 3114380 B2 | 12/2000 |
| JP | 2003-501823 A | 1/2003 |
| JP | 5282507 B2 | 9/2013 |
| JP | 2019-86802 A | 6/2019 |
| KR | 10-2014-0004057 A | 1/2014 |

OTHER PUBLICATIONS

International Search Report dated Apr. 19, 2022 in International Application No. PCT/JP2022/005224 filed Feb. 9, 2022, 5 pages (with English Translation).
Written Opinion dated Apr. 19, 2022 in International Application No. PCT/JP2022/005224 filed Feb. 9, 2022, 5 pages (with English Translation).

* cited by examiner

*Primary Examiner* — Christopher G Young
(74) *Attorney, Agent, or Firm* — Oblon, McClelland, Maier & Neustadt, L.L.P.

(57) ABSTRACT

The present invention relates to a reflective mask blank for EUV lithography, including: a substrate, a multilayer reflective film reflecting EUV light, and a phase shift film shifting a phase of the EUV light, in which the substrate, the multilayer reflective film, and the phase shift film are formed in this order, the phase shift film includes a layer 1 including ruthenium (Ru) and nitrogen (N), and the layer 1 has an absolute value of a film stress of 1,000 MPa or less.

18 Claims, 4 Drawing Sheets

REFLECTIVE MASK BLANK FOR EUV LITHOGRAPHY, REFLECTIVE MASK FOR EUV LITHOGRAPHY, AND METHOD FOR MANUFACTURING SAME

CROSS-REFERENCE TO RELATED APPLICATIONS

This is a bypass continuation of International Patent Application No. PCT/JP2022/005224, filed on Feb. 9, 2022, which claims priority to Japanese Patent Application No. 2021-022583, filed on Feb. 16, 2021. The contents of these applications are hereby incorporated by reference in their entireties.

TECHNICAL FIELD

The present invention relates to a reflective mask blank for extreme ultra violet (EUV) lithography (hereinafter, referred to as an "EUV mask blank" in the present description), a reflective mask for EUV lithography (hereinafter, referred to as an "EUV mask" in the present description), and methods for manufacturing the same.

BACKGROUND ART

In the related art, a photolithography method using visible light or ultraviolet light has been used in a semiconductor industry as a technique for transferring a fine pattern, which is necessary for forming an integrated circuit including a fine pattern on an Si substrate or the like. However, while miniaturization of a semiconductor device is accelerated, a limit of the photolithography method in the related art is approaching. In a case of the photolithography method, a resolution limit of a pattern is about ½ of an exposure wavelength. It is said that the limit is ¼ of an exposure wavelength even in the case where a liquid immersion method is used, and the limit is expected to be about 20 nm to 30 nm even in the case where a liquid immersion method using an ArF laser (193 nm) is used. Therefore, EUV lithography with an exposure technique using EUV light having a wavelength shorter than that of an ArF laser is expected as an exposure technique for 20 nm to 30 nm or shorter. In this description, EUV light refers to light having a wavelength in a soft X-ray region or a vacuum ultraviolet region. Specifically, it refers to light having a wavelength of about 10 nm to 20 nm, particularly about 13.5 nm±0.3 nm.

The EUV light is easily absorbed by various substance, and a refractive index of the substance is close to 1 at this wavelength. Therefore, it is impossible to use a refractive optical system such as the photolithography method using visible light or ultraviolet light in the related art. Therefore, in the EUV lithography, a reflective optical system, that is, a reflective photomask and a mirror are used.

On the other hand, a technique for improving a resolution using a phase shift mask has been proposed separately from shortening the wavelength of light. By forming a transmission part of a mask pattern into a substance or a shape different from that of the adjacent transmission part, the phase shift mask provides a phase difference of 180 degrees to the light transmitted through the transmission parts. Therefore, in a region between the transmission parts, the transmitted diffraction light having phases different from each other by 180 degrees cancel each other, a light intensity becomes extremely small, a mask contrast is improved, and as a result, a depth of focus at the time of transfer is expanded, and a transfer accuracy is improved. In principle, it is best that the phase difference is 180 degrees, but if the phase difference is substantially about 175 degrees to 185 degrees, an effect of improving the resolution can be sufficiently exerted.

A half tone-type mask, which is a kind of phase shift mask, is a phase shift mask in which as a material constituting a mask pattern, a thin film that is transflective with respect to exposure light is used as an absorption layer, and a phase difference of about 175 degrees to 185 degrees with respect to general light transmitted through a substrate is provided while attenuating transmittance to about several % (generally, about 2.5% to 15.0% with respect to the light transmitted through a substrate), thereby improving a resolution of a pattern edge portion and improving the transfer accuracy.

In the EUV exposure, a reflective optical system is used, a numerical aperture (NA) is small, and the wavelength is short, and thus as a specific problem, it is easily affected by surface irregularities of a mirror or a mask, and it is not easy to accurately resolve a target fine line width. For this reason, there has been proposed a half tone-type EUV mask that enables a principle of a half tone-type mask used in excimer laser exposure in the related art or the like to be applied to EUV exposure using a reflective optical system (for example, see Patent Literature 1).

In Patent Literature 1, by using a layer that has a small refractive index n and contains Ru as a phase shift film, a thickness for obtaining a predetermined phase difference is reduced, and a finer and highly accurate phase shift pattern can be formed.

Patent Literature 1: Japanese Patent No. 5282507

SUMMARY OF INVENTION

With a demand for fining a pattern, slight warpage of a EUV mask blank has become a problem. If an amount of warpage of the EUV mask blank exceeds 300 nm, a position accuracy of a pattern may be lowered when the EUV mask blank is patterned. In the case where warpage of such an amount occurs, a pattern position deviation or a pattern defect may occur when pattern transfer is performed using a reflective mask manufactured from an EUV mask blank.

An object of the present invention is to provide an EUV mask blank which includes a phase shift film and in which warpage is prevented, in order to solve the above problems in the related art.

(1) A reflective mask blank for EUV lithography, including:
    a substrate,
    a multilayer reflective film reflecting EUV light, and
    a phase shift film shifting a phase of the EUV light,
    in which the substrate, the multilayer reflective film, and the phase shift film are formed in this order,
    the phase shift film comprises a layer 1 including ruthenium (Ru) and nitrogen (N), and
    the layer 1 has an absolute value of a film stress of 1,000 MPa or less.

(2) The reflective mask blank for EUV lithography according to (1), in which a full width at half maximum FWHM of a diffraction peak attributed to an Ruhcp (002) plane among diffraction peaks derived from the layer 1 by an out of plane XRD method is 0.5° or more.

(3) The reflective mask blank for EUV lithography according to (1), in which a diffraction angle 2θ of a diffraction peak attributed to an Ruhcp (002) plane among diffraction peaks derived from the layer 1 by an out of plane XRD method is 42° or less.

(4) The reflective mask blank for EUV lithography according to any one of (1) to (3), in which a ($^{102}$Ru$^+$+$^{14}$N$^+$)/$^{102}$Ru$^+$ average intensity ratio of the layer 1 measured by secondary ion mass spectrometry is 0.0030 or more and 0.020 or less.
(5) The reflective mask blank for EUV lithography according to any one of (1) to (4), in which the phase shift film further comprises a layer 2 including at least one element (X) selected from the group consisting of chromium (Cr), tantalum (Ta), titanium (Ti), rhenium (Re), tungsten (W), bismuth (Bi), manganese (Mn), platinum (Pt), copper (Cu), iridium (Ir), and vanadium (V).
(6) The reflective mask blank for EUV lithography according to (5), in which the layer 2 further comprises at least one element selected from the group consisting of oxygen (O), N, boron (B), and carbon (C).
(7) The reflective mask blank for EUV lithography according to (5), in which the layer 2 further comprises Ru and at least one of O and N.
(8) The reflective mask blank for EUV lithography according to any one of (1) to (7), in which the phase shift film has a thickness of 20 nm to 60 nm.
(9) The reflective mask blank for EUV lithography according to any one of (1) to (8), in which a phase difference between reflected light of the EUV light from the multilayer reflective film and reflected light of the EUV light from the phase shift film is 150 degrees to 250 degrees, and
a relative reflectance between an EUV light reflectance of a surface of the phase shift film and an EUV light reflectance of a surface of the multilayer reflective film ((EUV light reflectance of surface of phase shift film/ EUV light reflectance of surface of multilayer reflective film)×100) is 2% to 37%.
(10) The reflective mask blank for EUV lithography according to any one of (1) to (9), in which a protective film for the multilayer reflective film is formed between the multilayer reflective film and the phase shift film.
(11) The reflective mask blank for EUV lithography according to (10), in which the protective film comprises at least one element selected from the group consisting of Ru, palladium (Pd), Ir, rhodium (Rh), Pt, zirconium (Zr), niobium (Nb), Ta, Ti, and silicon (Si).
(12) The reflective mask blank for EUV lithography according to (11), in which the protective film further comprises at least one element selected from the group consisting of O, N, and B.
(13) The reflective mask blank for EUV lithography according to any one of (1) to (12), further including an etching mask film on the phase shift film, the etching mask film including at least one element selected from the group consisting of Nb, Ti, Mo, Ta, and Si.
(14) The reflective mask blank for EUV lithography according to (13), in which the etching mask film further comprises at least one element selected from the group consisting of O, N, and B.
(15) A reflective mask for EUV lithography, including a pattern formed on the phase shift film of the reflective mask blank for EUV lithography according to any one of (1) to (14).
(16) A method for manufacturing a reflective mask blank for EUV lithography, the method including:
forming a multilayer reflective film reflecting EUV light on or above a substrate; and
forming a phase shift film shifting a phase of the EUV light on or above the multilayer reflective film,
in which the phase shift film comprises a layer 1 including Ru and N, and
the layer 1 is formed by performing a reactive sputtering method using a target including Ru in an inert gas atmosphere including argon (Ar) and N$_2$ and having a volume ratio of N$_2$ of 1 vol % to 40 vol %.
(17) A method for manufacturing a reflective mask blank for EUV lithography, the method including:
forming a multilayer reflective film reflecting EUV light on or above a substrate; and
forming a phase shift film shifting a phase of the EUV light on or above the multilayer reflective film,
in which the phase shift film comprises a layer 1 including Ru and N, and
the layer 1 is formed by performing a reactive sputtering method using a target including Ru in an inert gas atmosphere including Ar, krypton (Kr), and N$_2$ and having a volume ratio of N$_2$ of 1 vol % to 40 vol %.
(18) A method for manufacturing a reflective mask for EUV lithography, the method including patterning a phase shift film of a reflective mask blank for EUV lithography manufactured by the method for manufacturing a reflective mask blank for EUV lithography according to (16) or (17) to form a pattern.

Advantageous Effects of Invention

The EUV mask blank according to an embodiment of the present invention includes a phase shift film and is prevented from warping.

DESCRIPTION OF EMBODIMENTS

Hereinafter, an EUV mask blank according to an embodiment of the present invention and an EUV mask according to an embodiment of the present invention will be described with reference to the drawings.
A reflective mask blank for EUV lithography according to an embodiment of the present invention is a reflective mask blank for EUV lithography in which a multilayer reflective film that reflects EUV light and a phase shift film that shifts a phase of the EUV light are formed in this order on or above a substrate, the phase shift film includes a layer 1 containing ruthenium (Ru) and nitrogen (N), and the layer 1 has an absolute value of a film stress of 1,000 MPa or less.

Figure 1:
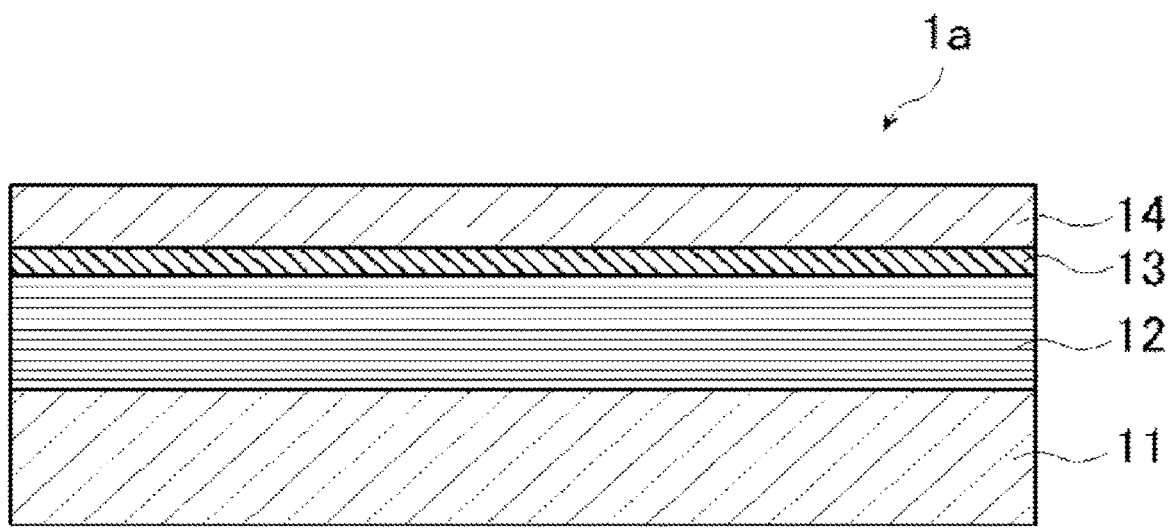
FIG. 1 is a schematic cross-sectional view illustrating an embodiment of an EUV mask blank according to the present invention.

FIG. 1 is a schematic cross-sectional view illustrating an embodiment of the EUV mask blank according to the present invention. In an EUV mask blank 1a illustrated in FIG. 1, a multilayer reflective film 12 that reflects EUV light, a protective film 13 for the multilayer reflective film 12, and a phase shift film 14 that shifts a phase of the EUV light are formed in this order on or above a substrate 11. However, in the EUV mask blank according to an embodiment of the present invention, only the substrate 11, the multilayer reflective film 12, and the phase shift film 14 are essential in the configuration illustrated in FIG. 1, and the protective film 13 is optional component.

The protective film 13 for the multilayer reflective film 12 is optional layer provided for a purpose of protecting the multilayer reflective film 12 at the time of pattern formation of the phase shift film 14.

Hereinafter, individual components of the EUV mask blank 1a will be described.

The substrate 11 satisfies characteristics as a substrate for an EUV mask blank. Therefore, the substrate 11 has a low coefficient of thermal expansion, and is excellent in smoothness, flatness, and resistance to a cleaning solution used for cleaning a mask blank or a photomask after pattern formation. Specifically, the low coefficient of thermal expansion means that the coefficient of thermal expansion at 20° C. is preferably $0\pm0.05\times10^{-7}/°$ C. and more preferably $0\pm0.03\times10^{-7}/°$ C.

As the substrate 11, specifically, glass having a low coefficient of thermal expansion, for example, an $SiO_2$—$TiO_2$ glass or the like is used, but without being limited thereto, for example, a crystallized glass in which a n-quartz solid solution is precipitated, a quartz glass, or a substrate of silicon, metal, or the like can also be used.

In the case where the substrate 11 has a smooth surface with a surface roughness (rms) of 0.15 nm or less and has a flatness of 100 nm or less, high reflectance and transfer accuracy can be obtained in a photomask after pattern formation. Therefore, the substrate 11 is preferable. The surface roughness (rms) of the substrate 11 is measured using an atomic force microscope.

The size, thickness, and the like of the substrate 11 are appropriately determined by design values and the like of the mask. In Examples to be described later, an $SiO_2$—$TiO_2$ glass having an outer shape of 6 inches (152 mm) square and a thickness of 0.25 inches (6.3 mm) is used.

It is preferable that no defect be present on a surface of the substrate 11 on which the multilayer reflective film 12 is formed. However, even in the case where a defect is present, there are no problems as long as a phase defect does not occur due to a concave defect and/or a convex defect.

Specifically, a depth of the concave defect and a height of the convex defect are preferably 2 nm or less, and full widths at half maximum of the concave defect and the convex defect are preferably 60 nm or less. The full width at half maximum of the concave defect refers to a width at a depth position of ½ of the depth of the concave defect. The full width at half maximum of the convex defect refers to a width at a height position of ½ of the height of the convex defect.

The multilayer reflective film 12 achieves a high EUV light reflectance by alternately laminating a high refractive index layer and a low refractive index layer a plurality of times. In the multilayer reflective film 12, Mo is widely used for the high refractive index layer, and Si is widely used for the low refractive index layer. That is, an Mo/Si multilayer reflective film is the most common. However, the multilayer reflective film is not limited thereto, and for example, an Ru/Si multilayer reflective film, an Mo/Be multilayer reflective film, an Mo compound/Si compound multilayer reflective film, an Si/Mo/Ru multilayer reflective film, an Si/Mo/Ru/Mo multilayer reflective film, or an Si/Ru/Mo/Ru multilayer reflective film may be used.

The multilayer reflective film 12 is not particularly limited as long as it has desired characteristics as a reflective layer of an EUV mask blank. Here, the characteristic particularly required for the multilayer reflective film 12 is a high EUV light reflectance. Specifically, when the surface of the multilayer reflective film 12 is irradiated with light in a wavelength region of EUV light at an incident angle of 6 degrees, the maximum value of the light reflectance at a wavelength of 13.5 nm is preferably 60% or more, and more preferably 65% or more. Even in the case where the protective film 13 is provided on the multilayer reflective film 12, the maximum value of the light reflectance at a wavelength of 13.5 nm is preferably 60% or more, and more preferably 65% or more.

A thickness of each of the layers constituting the multilayer reflective film 12 and the number of repeating units of the layer can be appropriately selected according to a film material to be used and the EUV light reflectance required for the reflective layer. Taking the Mo/Si multilayer reflective film as an example, in order to obtain the multilayer reflective film 12 in which the maximum value of the EUV light reflectance is 60% or more, the multilayer reflective film may be formed by laminating an Mo layer having a film thickness of 2.3 nm±0.1 nm and an Si layer having a film thickness of 4.5 nm±0.1 nm so that the number of repeating units becomes 30 to 60.

Each of the layers constituting the multilayer reflective film 12 may be formed to have a desired thickness using a known film forming method such as a magnetron sputtering method and an ion beam sputtering method.

For example, in the case where an Si/Mo multilayer reflective film is formed using the ion beam sputtering method, an Si film is formed to have a thickness of 4.5 nm at an ion accelerating voltage of 300 V to 1,500 V and a film formation rate of 0.030 nm/sec to 0.300 nm/sec using an Si target as a target and using an Ar gas (gas pressure of $1.3\times10^{-2}$ Pa to $2.7\times10^{-2}$ Pa) as a sputtering gas. Next, it is preferable that an Mo film be formed to have a thickness of 2.3 nm at an ion accelerating voltage of 300 V to 1,500 V and a film formation rate of 0.030 nm/sec to 0.300 nm/sec using an Mo target as a target and using an Ar gas (gas pressure of $1.3\times10^{-2}$ Pa to $2.7\times10^{-2}$ Pa) as a sputtering gas. The Si/Mo multilayer reflective film is formed by laminating the Si film and the Mo film for 40 cycles to 50 cycles with the above as 1 cycle.

In order to prevent oxidation of the surface of the multilayer reflective film 12, it is preferable that the uppermost layer of the multilayer reflective film 12 be a layer of a material which is hardly oxidized. The layer of a material which is hardly oxidized functions as a cap layer for the multilayer reflective film 12. Specific examples of the layer of a material which is hardly oxidized, the layer functioning as a cap layer, include an Si layer. In the case where the multilayer reflective film 12 is an Si/Mo multilayer reflective film, the uppermost layer functions as a cap layer by using the Si layer as the uppermost layer. In this case, a thickness of the cap layer is preferably 11±2 nm.

The protective film 13 is preferably provided for a purpose of protecting the multilayer reflective film 12 so that the multilayer reflective film 12 is not further damaged by an etching process when a pattern is formed on the phase shift film 14 by the etching process, generally by a dry etching process. Therefore, as a material of the protective film, it is preferable to select a material which is less likely to be affected by the etching process on the phase shift film 14, that is, a substance which has an etching rate lower than that of the phase shift film 14 and is less likely to be damaged by the etching process.

In order to satisfy the above characteristics, the protective film 13 preferably contains at least one element selected from the group consisting of Ru, palladium (Pd), Ir, rhodium (Rh), Pt, zirconium (Zr), niobium (Nb), Ta, Ti, and silicon (Si). However, since Ru is also a constituent material of the phase shift film 14, an alloy with other elements is preferably used in the case where Ru is used as the material of the protective film 13. Specific examples thereof include RuZr.

The protective film 13 may further contain at least one element selected from the group consisting of O, N, and B. That is, it may be an oxide, a nitride, an oxynitride, or a boride of the above elements. Specific examples thereof include $ZrO_2$ and $SiO_2$.

A thickness of the protective film 13 is not particularly limited, but is preferably 2 nm to 3 nm in the case of an RuZr film.

The protective film 13 can be formed by a known film forming method such as a magnetron sputtering method and an ion beam sputtering method. For example, in the case where an RuZr film is formed using a DC sputtering method, it is preferable to form a film to have a thickness of 2 nm to 3 nm by using an Ru target and a Zr target as targets and using an Ar gas (gas pressure of $1.0 \times 10^{-2}$ Pa to $1.0 \times 10^{0}$ Pa) as a sputtering gas, at electric powers supplied to the Ru target and the Zr target of 100 W or more and 600 W or less, respectively, and a film formation rate of 0.020 nm/sec to 1.000 nm/sec.

In the EUV mask blank 1a according to an embodiment of the present invention, the phase shift film 14 includes the layer 1 containing ruthenium (Ru) and nitrogen (N).

Although details will be described later, the layer 1 can be formed using a sputtering method. In the layer 1 formed using the sputtering method, a compressive stress or a tensile stress is generated. In the case where the film stress of the layer 1 is measured according to the procedure described in Examples below, the compressive stress has a negative value and the tensile stress has a positive value. In the EUV mask blank 1a according to an embodiment of the present invention, the absolute value of the film stress of the layer 1 is 1,000 MPa or less regardless of whether the film stress generated in the layer 1 is a compressive stress or a tensile stress. In the case where the absolute value of the stress of the layer 1 is in the above range, the warpage of the EUV mask blank is prevented, and the amount of warpage becomes 300 nm or less.

The layer 1 contains Ru and N, and a content ratio of Ru and N in the layer 1 is not particularly limited as long as the absolute value of the film stress is in the above range.

A preferable example of the content ratio of Ru and N in the layer 1 is a case where R in a range of 98.0 at % to 99.9 at % and N in a range of 0.1 at % to 2.0 at % are contained.

The content of each element in the layer 1 is measured by an X-ray photoelectron spectrometer (XPS).

A preferable example of the content ratio of Ru and N in the layer 1 may be specified by a method other than the XPS. For example, a preferable example of the content ratio of Ru and N in the layer 1 may be specified by obtaining a depth direction profile of a $(^{102}Ru^{+}+^{14}N^{+})/^{102}Ru^{+}$ intensity ratio by dividing $^{102}Ru^{+}$ from a $(^{102}Ru^{+}+^{14}N^{+})$ profile of the layer 1 measured by secondary ion mass spectrometry (SIMS), and then calculating a $(^{102}Ru^{+}+^{14}N^{+})/^{102}Ru^{+}$ average intensity ratio in a region where a secondary ion intensity of ruthenium (Ru) is horizontally stable.

The $(^{102}Ru^{+}+^{14}N^{+})/^{102}Ru^{+}$ average intensity ratio of the layer 1 measured by the SIMS is preferably 0.0030 or more. The $(^{102}Ru^{+}+^{14}N^{+})/^{102}Ru^{+}$ average intensity ratio of the layer 1 measured by the SIMS is preferably 0.020 or less, and more preferably 0.0090 or less.

In the EUV mask blank 1a according to an embodiment of the present invention, a full width at half maximum FWHM of a diffraction peak attributed to an Ruhcp (002) plane among diffraction peaks derived from the layer 1 observed by an out of plane XRD method is preferably 0.5° or more. In the case where the full width at half maximum FWHM is 0.5° or more, the crystallization of the layer 1 is prevented, and the smoothness of the surface of the phase shift film 14 is increased. The full width at half maximum FWHM is preferably 0.5° or more, more preferably 0.6° or more, and still more preferably 0.65° or more. An upper limit of the full width at half maximum FWHM of the diffraction peak attributed to the Ruhcp (002) plane is not particularly limited, but is preferably 1.0° or less, and more preferably 0.9° or less.

In the EUV mask blank 1a according to an embodiment of the present invention, a diffraction angle 2θ of a diffraction peak attributed to an Ruhcp (002) plane among diffraction peaks derived from the layer 1 by an out of plane XRD method is 42° or less. In the case where the diffraction angle 2θ is 42° or less, the crystallization of the layer 1 is prevented, and the smoothness of the surface of the phase shift film 14 is increased. A lower limit of the diffraction angle 2θ is not particularly limited, but is preferably 40.90° or more, more preferably 41.00° or more, and still more preferably 41.50° or more. An upper limit of the diffraction angle 2θ of the diffraction peak attributed to the Ruhcp (002) plane is preferably 42° or less, more preferably 41.80° or less, and still more preferably 41.60° or less.

In the present description, the surface roughness (rms) of the surface of the phase shift film 14 measured using an atomic force microscope is used as an index of the smoothness of the surface of the phase shift film 14.

In the EUV mask blank 1a according to an embodiment of the present invention, the surface roughness (rms) of the surface of the phase shift film 14 is preferably 0.50 nm or less, and more preferably 0.45 nm or less. The surface roughness (rms) of the surface of the phase shift film 14 is preferably 0.10 nm or more, more preferably 0.15 nm or more, and still more preferably 0.20 nm or more.

The phase shift film 14 may further include a layer 2 containing at least one element (X) selected from the group consisting of chromium (Cr), tantalum (Ta), titanium (Ti), rhenium (Re), tungsten (W), bismuth (Bi), manganese (Mn), platinum (Pt), copper (Cu), iridium (Ir), and vanadium (V). As the element (X), Cr, Ta, Pt, and Ir are preferable, and Cr and Ta are more preferable.

The layer 2 may further contain at least one element selected from the group consisting of oxygen (O), N, boron (B), and carbon (C) in addition to the element (X).

The layer 2 may contain Ru and at least one of O and N in addition to the element (X).

In one aspect in which Ru and at least one of O and N are contained in addition to the element (X), the layer 2 preferably contains the total (Ru+X) of Ru and X in a range of 40 at % to 99 at % and O in a range of 1 at % to 60 at %, more preferably contains Ru+X in a range of 50 at % to 99 at % and O in a range of 1 at % to 50 at %, and still more preferably contains Ru+X in a range of 80 at % to 99 at % and O in a range of 1 at % to 20 at %.

In another aspect in which Ru and at least one of O and N are contained in addition to the element (X), the layer 2 preferably contains the total (Ru+X) of Ru and X in a range of at % to 98 at %, O in a range of 1 at % to 69 at %, and N in a range of 1 at % to 69 at %, more preferably contains Ru+X in a range of 50 at % to 98 at %, O in a range of 1 at % to 30 at %, and N in a range of 1 at % to 20 at %, and still more preferably contains Ru+X in a range of 70 at % to 98 at %, O in a range of 1 at % to 20 at %, and N in a range of 1 at % to 10 at %.

In still another aspect in which Ru and at least one of O and N are contained in addition to the element (X), the layer 1 preferably contains the total (Ru+X) of Ru and X in a range of 30 at % to 90 at % and N in a range of 10 at % to 70 at %, and more preferably contains Ru+X in a range of 60 at % to 90 at % and N in a range of 10 at % to 40 at % in a case of containing the element (X).

A composition ratio (at %) (Ru:X) of Ru and X in the layer 2 according to each of the above three aspects is preferably in a range of 20:1 to 1:5, more preferably in a range of 4:1 to 1:4, and still more preferably in a range of 2:1 to 1:2.

In the above three aspects, in the case where the layer 2 contains two or more elements as the element (X), X in the composition ratio (Ru:X) and the total (Ru+X) of Ru and X represents the total of the two or more elements.

The phase shift film 14 includes the layer 2, whereby the EUV light reflectance can be adjusted. However, if the thickness of the layer 2 is too large, the reflectance becomes too small. Therefore, a relative ratio ((thickness of layer 1):(thickness of layer 2)) of the thicknesses of the layer 1 and the layer 2 is preferably within a range of 1:1 to 30:1, and more preferably within a range of 5:1 to 20:1.

In the case where the phase shift film 14 includes two or more layers 2, the thickness of the layer 2 is a total thickness of the two or more layers 2.

In the case where the phase shift film 14 includes the layer 2, an arrangement of the layer 1 and the layer 2 in the phase shift film 14 is not particularly limited. The layer 2 may be formed on the layer 1, and the layer 1 may be formed on the layer 2.

It is preferable that the phase shift film 14 of the EUV mask blank 1a have a thickness of 20 nm or more because desired optical characteristics as a phase shift film of a half tone-type EUV mask shown below can be achieved.

Further, it is preferable that the thickness of the layer 1 of the phase shift film 14 be nm or more because desired optical characteristics as a phase shift film of a half tone-type EUV mask shown below can be achieved.

In the case where the light reflectance at a wavelength of 13.5 nm when the surface of the phase shift film 14 is irradiated with light in a wavelength region of EUV light at an incident angle of 6° is defined as the EUV light reflectance of the surface of the phase shift film, and the light reflectance at a wavelength of 13.5 nm when the surface of the multilayer reflective film 12 is irradiated with light in the wavelength region of EUV light at an incident angle of 6 degrees is defined as the EUV light reflectance of the surface of the multilayer reflective film, a relative reflectance ((EUV light reflectance of surface of phase shift film/EUV light reflectance of surface of multilayer reflective film)×100) between the EUV light reflectance of the surface of the phase shift film and the EUV light reflectance of the surface of the multilayer reflective film is preferably 2% to 37%, more preferably 4% to 20%, and still more preferably 6% to 15%.

A phase difference between reflected light of the EUV light from the multilayer reflective film 12 and reflected light of the EUV light from the phase shift film 14 is preferably 150 degrees to 250 degrees, and more preferably 180 degrees to 230 degrees.

The thickness of the phase shift film 14 of the EUV mask blank 1a is more preferably nm or more, and still more preferably 35 nm or more.

The thickness of the layer 1 of the phase shift film 14 is preferably 20 nm or more, and more preferably 30 nm or more.

It is preferable that the phase shift film 14 of the EUV mask blank 1a have a thickness of 60 nm or less because a shadowing effect is reduced.

In principle, the use of a half tone-type EUV mask is an effective means for improving a resolution in EUV lithography. However, even in the case of a half tone-type EUV mask, the optimum reflectance depends on exposure conditions and a pattern to be transferred, and it is difficult to determine the optimum reflectance unconditionally.

Since the EUV exposure is reflective exposure, the incident light is incident from a slightly oblique direction (generally about 6°) rather than a perpendicular direction, and becomes reflected light by the EUV mask. In the EUV mask, the phase shift film is processed into a pattern, but since the EUV light is obliquely incident, a shadow of the pattern is generated. Therefore, a transfer resist pattern on a wafer formed by the reflected light deviates from an original pattern position depending on an incident direction and an arrangement direction of the pattern. It is called the shadowing effect, which is a problem of EUV exposure.

In order to reduce the shadowing effect, a length of a shadow can be shortened, and for that reason, a height of a pattern can be reduced as much as possible. In order to reduce the height of a pattern, it is necessary to make the phase shift film as thin as possible.

The thickness of the phase shift film 14 of the EUV mask blank 1a is more preferably nm or less, and still more preferably 50 nm or less.

The layer 1 of the phase shift film 14 can be formed by the following procedure using a reactive sputtering method.

In the case where the layer 1 of the phase shift film 14 is formed using the reactive sputtering method, the reactive sputtering method may be performed using a target containing Ru in an inert gas atmosphere containing argon (Ar) and $N_2$ and having a volume ratio of $N_2$ of 10 vol % to 40 vol %. The reactive sputtering method may be performed using a target containing Ru in an inert gas atmosphere containing Ar, krypton (Kr), and $N_2$ and having a volume ratio of $N_2$ of 10 vol % to 40 vol %. In the latter case, a volume ratio of Kr in the inert gas atmosphere is preferably 30 vol % to 50 vol %.

The reactive sputtering method other than the above may be carried out under the following conditions.

Gas pressure: $5 \times 10^{-2}$ Pa to 1.0 Pa, preferably $1 \times 10^{-1}$ Pa to $8 \times 10^{-1}$ Pa, more preferably $2 \times 10^{-1}$ Pa to $4 \times 10^{-1}$ Pa.

Supplied electric power density per target area: 1.0 $W/cm^2$ to 15.0 $W/cm^2$, preferably 3.0 $W/cm^2$ to 12.0 $W/cm^2$, more preferably 4.0 $W/cm^2$ to 10.0 $W/cm^2$.

Film formation rate: 0.010 nm/sec to 1.000 nm/sec, preferably 0.015 nm/sec to 0.500 nm/sec, more preferably 0.020 nm/sec to 0.300 nm/sec.

In the case where the phase shift film 14 includes the layer 2, the layer 2 can be formed using a known film forming method such as a magnetron sputtering method and an ion beam sputtering method.

For example, in the case where a layer 2 containing Ta as the element (X) and containing O and N is formed using a reactive sputtering method, formation may be performed under the following film formation conditions using a Ta target as a target and a mixed gas of $O_2$ and $N_2$ or a mixed gas containing an inert gas, $O_2$, and $N_2$ as a sputtering gas.

Sputtering gas: mixed gas of $O_2$ gas and $N_2$, or mixed gas of an Ar gas, $O_2$, and $N_2$ (volume ratio ($O_2/((O_2+N_2)$ or $(Ar+O_2+N_2))$ of $O_2$ gas in mixed gas)=0.010 to 0.750, preferably 0.100 to 0.500, more preferably 0.200 to 0.500.

Volume ratio ($N_2/((O_2+N_2)$ or $(Ar+O_2+N_2))$) of $N_2$ gas in mixed gas=0.010 to 0.750, preferably 0.010 to 0.500, and more preferably 0.010 to 0.200.

Gas pressure: $5 \times 10^{-2}$ Pa to $1 \times 1.0$ Pa, preferably $1 \times 10^{-1}$ to $8 \times 10^{-1}$ Pa, more preferably $2 \times 10^{-1}$ to $4 \times 10^{-1}$ Pa).

Supplied electric power density per target area: 1.0 W/cm$^2$ to 15.0 W/cm$^2$, preferably 3.0 W/cm$^2$ to 12.0 W/cm$^2$, more preferably 4.0 W/cm$^2$ to 10.0 W/cm$^2$.

Film formation rate: 0.010 nm/sec to 1.000 nm/sec, preferably 0.015 nm/sec to 0.500 nm/sec, more preferably 0.020 nm/sec to 0.300 nm/sec.

For example, in the case where a layer 2 containing Cr as the element (X) and containing N is formed using a reactive sputtering method, the formation may be performed under the following film formation conditions using a Cr target as a target and using an $N_2$ gas or a mixed gas containing an inert gas and $N_2$ as a sputtering gas.

Sputtering gas: $N_2$ gas, or a mixed gas of an Ar gas and $N_2$ (volume ratio ($N_2/(Ar+N_2)$ of $N_2$ gas in sputtering gas)=0.100 to 1.000, preferably 0.200 to 0.750, more preferably 0.250 to 0.500.

Gas pressure: $5 \times 10^{-2}$ Pa to 1.0 Pa, preferably $1 \times 10^{-1}$ Pa to $8 \times 10^{-1}$ Pa, more preferably $2 \times 10^{-1}$ Pa to $4 \times 10^{-2}$ Pa.

Supplied electric power density per target area: 1.0 W/cm$^2$ to 15.0 W/cm$^2$, preferably 3.0 W/cm$^2$ to 12.0 W/cm$^2$, more preferably 4.0 W/cm$^2$ to 10.0 W/cm$^2$.

Film formation rate: 0.010 nm/sec to 1.000 nm/sec, preferably 0.015 nm/sec to 0.500 nm/sec, more preferably 0.020 nm/sec to 0.300 nm/sec.

In the case where an inert gas other than Ar is used, a concentration of the inert gas is preferably in the same concentration range as the above Ar gas concentration. In the case where a plurality of types of inert gases are used, a total concentration of the inert gases is preferably in the same concentration range as the above Ar gas concentration.

In the pattern formation for the layer 1 of the phase shift film 14, it is preferable to use dry etching using $O_2$ or a mixed gas of $O_2$ and a halogen gas (chlorine gas or fluorine gas) as an etching gas.

It is preferable that the layer 1 of the phase shift film 14 can be etched at an etching rate of 10 nm/min or more when dry etching is performed using $O_2$ or a mixed gas of $O_2$ and a halogen gas (chlorine gas or fluorine gas) as an etching gas.

The mixed gas of $O_2$ and a halogen gas preferably contains $O_2$ in an amount of 40 vol % or more and less than 100 vol %, more preferably 75 vol % to 90 vol %, and preferably contains a chlorine gas or a fluorine gas in an amount of more than 0 vol % and 60 vol % or less, more preferably 10 vol % to 25 vol %.

As the chlorine gas, it is preferable to use a chlorine gas such as $Cl_2$, $SiCl_4$, $CHCl_3$, $CCl_4$, and $BCl_3$, or a mixed gas thereof. As the fluorine gas, it is preferable to use a fluorine gas such as $CF_4$, $CHF_3$, $SF_6$, $BF_3$, and $XeF_2$, or a mixed gas thereof.

In the case where the phase shift film 14 only includes the layer 1, a pattern can be formed on the phase shift film only by dry etching using $O_2$ or a mixed gas of $O_2$ and a halogen gas (chlorine gas or fluorine gas) as an etching gas. Therefore, the patterning process is simple.

In the case where the phase shift film 14 includes the layer 1 and the layer 2, a pattern can be formed on the phase shift film by dry etching in stages using two or more types of etching gases as necessary.

For example, in the case where the phase shift film 14 includes the layer 1 and a layer 2 containing Ta as the element (X), a pattern can be formed on the phase shift film by subjecting the layer 1 to dry etching using $O_2$ or a mixed gas of $O_2$ and a halogen gas (chlorine gas, fluorine gas) as an etching gas and subjecting the layer 2 to dry etching using a halogen gas (chlorine gas, fluorine gas) as an etching gas.

In the case where the layer 2 contains an element such as Cr, V, Mn, and Re forming a volatile oxide or an acid halide, a pattern can be formed on the phase shift film only by dry etching using $O_2$ or a mixed gas of $O_2$ and a halogen gas (chlorine gas or fluorine gas) as an etching gas for the layer 1 and the layer 2. Therefore, even in the case where the phase shift film 14 includes the layer 1 and the layer 2, the pattern forming process does not become complicated, and a pattern can be easily formed on the phase shift film.

Figure 2:
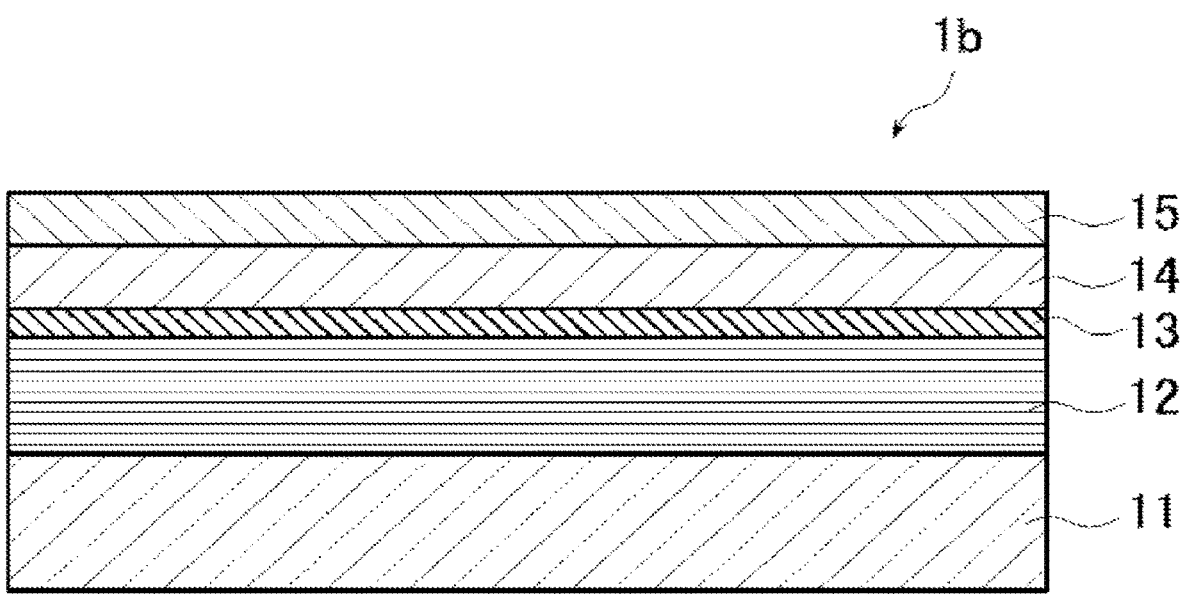
FIG. 2 is a schematic cross-sectional view illustrating another embodiment of the EUV mask blank according to the present invention.

FIG. 2 is a schematic cross-sectional view illustrating another embodiment of the EUV mask blank according to the present invention. In an EUV mask blank 1b illustrated in FIG. 2, a multilayer reflective film 12 that reflects EUV light, a protective film 13 for the multilayer reflective film 12, a phase shift film 14 that shifts a phase of the EUV light, and an etching mask film 15 are formed in this order on or above a substrate 11.

Among the components of the EUV mask blank 1b, the substrate 11, the multilayer reflective film 12, the protective film 13, and the phase shift film 14 are the same as those of the EUV mask blank 1a described above, and thus descriptions thereof are omitted.

It is generally known that a resist film can be thinned by providing a layer (etching mask film) of a material having resistance to etching conditions of a phase shift film on the phase shift film. That is, a resist film can be thinned by forming the etching mask film and lowering a relative rate (etching selectivity) of the etching rate of the etching mask film when the etching rate of the phase shift film is set to 1 in the etching conditions of the phase shift film.

The etching mask film 15 is required to have a sufficiently high etching selectivity in an etching condition of the phase shift film 14.

Therefore, the etching mask film 15 is required to have high etching resistance to dry etching using $O_2$ or a mixed gas of $O_2$ and a halogen gas (chlorine gas or fluorine gas) as an etching gas.

On the other hand, it is preferable that the etching mask film 15 can be removed by a cleaning solution using an acid or a base used as a cleaning solution for a resist film in EUV lithography.

Specific examples of the cleaning solution used for the above purpose include sulfuric acid-hydrogen peroxide mixture (SPM), ammonia-hydrogen peroxide mixture, and hydrofluoric acid. The SPM is a solution in which sulfuric acid and hydrogen peroxide are mixed, and sulfuric acid and hydrogen peroxide can be mixed at a volume ratio of preferably 4:1 to 1:3, and more preferably 3:1. At this time, a temperature of the SPM is preferably controlled to 100° C. or higher from the viewpoint of improving the etching rate.

The ammonia-hydrogen peroxide mixture is a solution in which ammonia and hydrogen peroxide are mixed, and $NH_4OH$, hydrogen peroxide and water can be mixed at a volume ratio of preferably 1:1:5 to 3:1:5. At this time, a temperature of the ammonia-hydrogen peroxide mixture is preferably controlled to 70° C. to 80° C.

In order to satisfy the above requirements, the etching mask film 15 of the EUV mask blank 1b according to an embodiment of the present invention preferably contains at least one element selected from the group consisting of Nb, Ti, Mo, Ta, and Si. The etching mask film 15 may further contain at least one element selected from the group consisting of N, and B. That is, an oxide, an oxynitride, a nitride, and a boride of the above elements may be used.

Specific examples of the constituent material of the etching mask film 15 include Nb materials such as Nb, $Nb_2O_5$, and NbON. The etching mask film 15 made of the Nb material(s) can be etched by dry etching using a chlorine gas as an etching gas. Specific examples thereof further include Mo materials such as Mo, $MoO_3$, and MoON.

The etching mask film 15 made of the Mo material(s) can be etched by dry etching using a chlorine gas as an etching gas, for example. Specific examples thereof further include Si materials such as Si $SiO_2$, and $Si_3N_4$.

The etching mask film 15 made of the Si material(s) can be etched by dry etching using a fluorine gas as an etching gas, for example. In the case where an Si material is used as the etching mask film 15, it is preferable to remove the etching mask film 15 by using a hydrofluoric acid as the cleaning solution.

A thickness of the etching mask film 15 is preferably 20 nm or less in terms of the removability by the cleaning solution. The etching mask film 15 made of the Nb material(s) more preferably has a thickness of 5 nm to 15 nm.

The etching mask film 15 can be formed by a known film forming method such as a magnetron sputtering method and an ion beam sputtering method.

For example, in the case where a NbN film is formed by a sputtering method, a reactive sputtering method using a Nb target may be performed in a gas atmosphere in which an inert gas (hereinafter, simply referred to as an inert gas) containing at least one of He, Ar, Ne, Kr, and Xe and oxygen are mixed. In the case where the magnetron sputtering method is used, specifically, the magnetron sputtering method may be performed under the following film formation conditions.

Sputtering gas: mixed gas of an Ar gas and $N_2$ (volume ratio of $O_2$ in mixed gas ($N_2/(Ar+N_2)$)=15 vol % or more)

Gas pressure: $5.0>10^{-2}$ Pa to 1.0 Pa, preferably $1.0\times10^{-1}$ to $8.0\times10^{-1}$ Pa, more preferably $2.0\times10^{-1}$ to $4.0\times10^{-1}$ Pa Supplied electric power density per target area: 1.0 $W/cm^2$ to 15.0 $W/cm^2$, preferably 3.0 $W/cm^2$ to 12.0 $W/cm^2$, more preferably 4.0 $W/cm^2$ to 10.0 $W/cm^2$ Film formation rate: 0.010 nm/sec to 1.0 nm/sec, preferably 0.015 nm/sec to 0.50 nm/sec, more preferably 0.020 nm/sec to 0.30 nm/sec Distance between target and substrate: 50 mm to 500 mm, preferably 100 mm to 400 mm, more preferably 150 mm to 300 mm In the case where an inert gas other than Ar is used, a concentration of the inert gas is preferably in the same concentration range as the above Ar gas concentration. In the case where a plurality of types of inert gases are used, a total concentration of the inert gases is preferably in the same concentration range as the above Ar gas concentration.

Each of the EUV mask blanks 1a and 1b according to the embodiments of the present invention may include a functional film known in the field of EUV mask blanks in addition to the multilayer reflective film 12, the protective film 13, the phase shift film 14, and the etching mask film 15.

Specific examples of such a functional film include a high dielectric coating to be applied to a back surface side of the substrate in order to promote electrostatic chucking of the substrate, as described in JP2003-501823A. Here, the back surface of the substrate refers to a surface of the substrate 11 in FIG. 1 opposite to a surface on which the multilayer reflective film 12 is formed.

For the high dielectric coating to be applied to the back surface of the substrate for such a purpose, an electrical conductivity and a thickness of the constituent material are selected so that a sheet resistance is 100 Ω/square or less. The constituent material of the high dielectric coating can be widely selected from those described in known documents. For example, a coating having a high dielectric constant, specifically, a coating made of Si, TiN, Mo, Cr, or TaSi, as described in JP2003-501823A, can be applied. A thickness of the high dielectric coating may be, for example, 10 nm to 1,000 nm.

The high dielectric coating can be formed by a known film forming method, for example, a sputtering method such as a magnetron sputtering method and an ion beam sputtering method, a CVD method, a vacuum deposition method, or an electrolytic plating method.

A method for manufacturing an EUV mask blank according to an embodiment of the present invention includes the following steps a) and b):
  a) forming a multilayer reflective film that reflects EUV light on or above a substrate; and
  b) forming a phase shift film that shifts a phase of the EUV light on or above the multilayer reflective film formed in the step a).

In the step b), the phase shift film includes the layer 1 containing Ru and N. The layer 1 is formed by performing a reactive sputtering method using a target containing Ru in an inert gas atmosphere containing argon (Ar) and $N_2$ and having a volume ratio of $N_2$ of 1 vol % to 40 vol %.

Alternatively, the layer 1 is formed by performing a reactive sputtering method using a target containing Ru in an inert gas atmosphere containing Ar, krypton (Kr), and $N_2$ and having a volume ratio of $N_2$ of 1 vol % to 40 vol %. By forming the layer 1 in an inert gas atmosphere including Kr, a stress of the layer 1 can be relaxed. In the case where the inert gas contains Kr, a volume ratio of Kr in the inert gas is preferably 20 vol % or more and 80 vol % or less.

Figure 3:
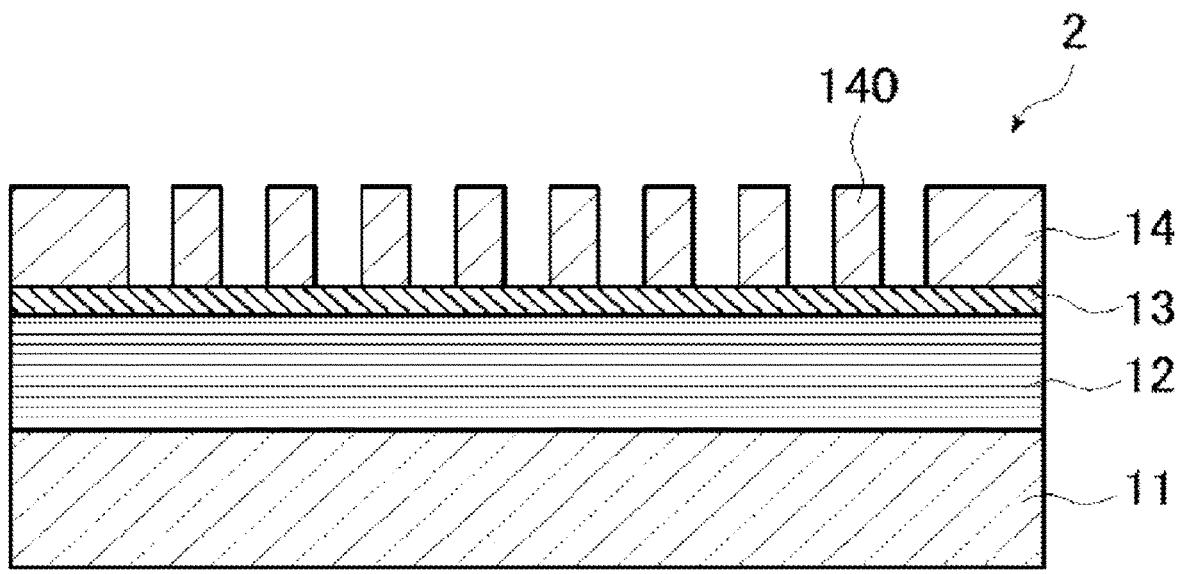
FIG. 3 is a schematic cross-sectional view illustrating an embodiment of an EUV mask according to the present invention.

FIG. 3 is a schematic cross-sectional view illustrating an embodiment of the EUV mask according to the present invention.

In an EUV mask 2 illustrated in FIG. 3, a pattern (phase shift film pattern) 140 is formed on the phase shift film 14 of the EUV mask blank 1a illustrated in FIG. 1. That is, the multilayer reflective film 12 that reflects EUV light, the protective film 13 for the multilayer reflective film 12, and the phase shift film 14 that shifts a phase of the EUV light are formed in this order on or above the substrate 11, and the pattern (phase shift film pattern) 140 is formed on the phase shift film 14.

Among the components of the EUV mask 2, the substrate 11, the multilayer reflective film 12, the protective film 13, and the phase shift film 14 are the same as those of the EUV mask blank 1a described above.

In the method for manufacturing an EUV mask according to an embodiment of the present invention, the phase shift film 14 of the EUV mask blank 1b manufactured by the method for manufacturing an EUV mask blank according to an embodiment of the present invention is patterned to form the pattern (phase shift film pattern) 140.

A procedure for forming a pattern on the phase shift film 14 of the EUV mask blank 1b will be described with reference to the drawings.

Figure 4:
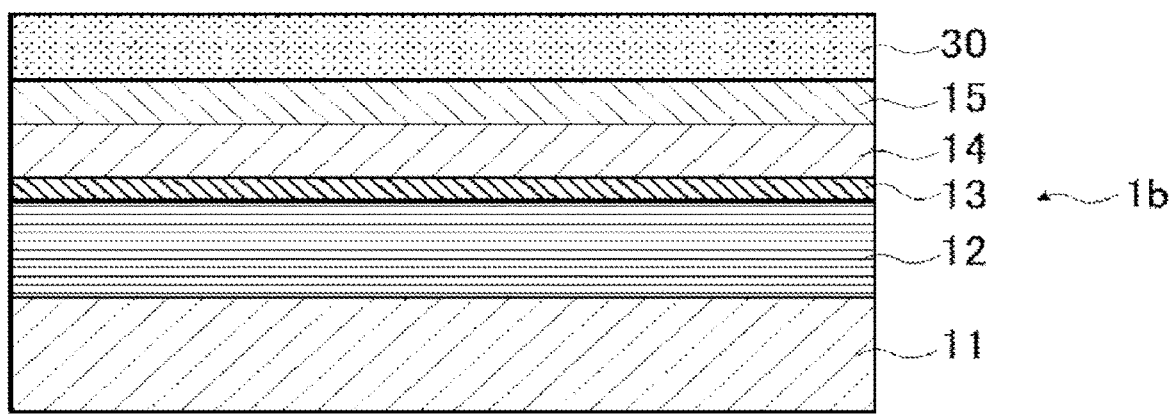
FIG. 4 is a view illustrating a procedure of forming a pattern on an EUV mask blank 1b illustrated in FIG. 2, in which a resist film 30 is formed on an etching mask film 15 of the EUV mask blank 1b.
Figure 5:
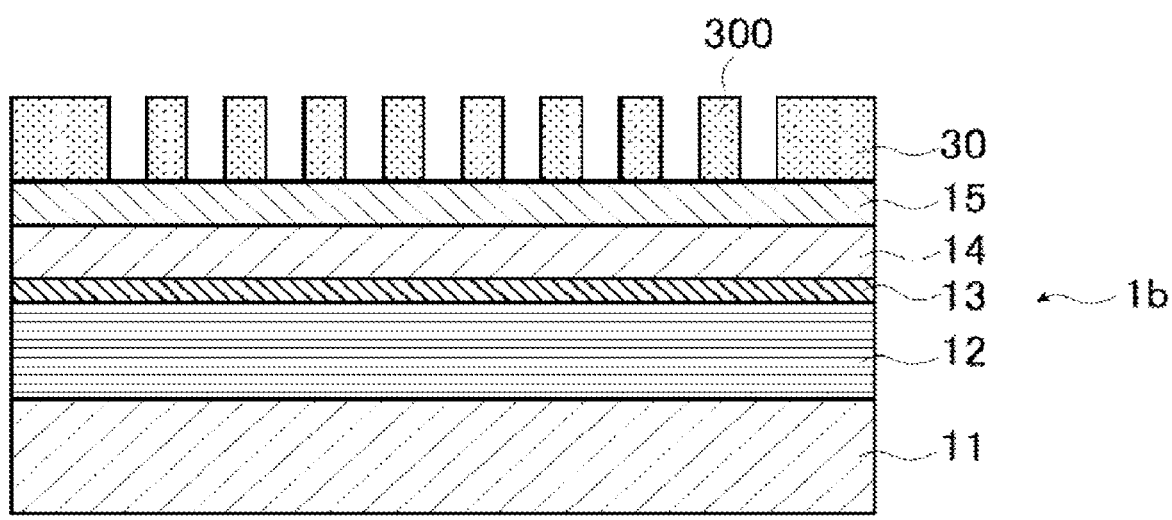
FIG. 5 is a view illustrating a procedure following FIG. 4, in which a resist pattern 300 is formed on the resist film 30.

As illustrated in FIG. 4, a resist film 30 is formed on the etching mask film 15 of the EUV mask blank 1b. Next, as illustrated in FIG. 5, a resist pattern 300 is formed on the resist film 30 using an electron beam lithography device.

Figure 6:
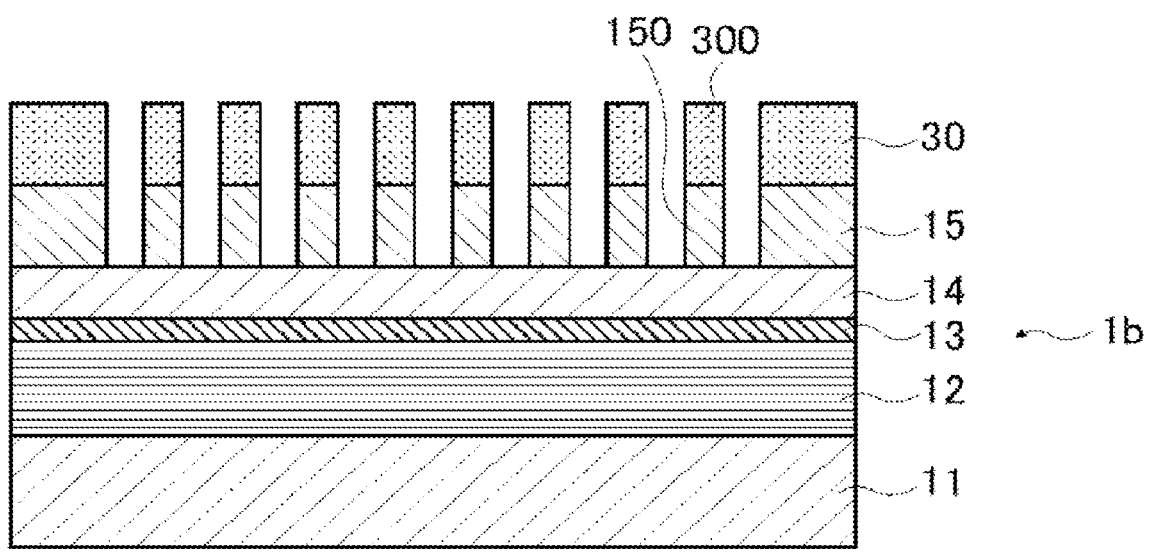
FIG. 6 is a view illustrating a procedure following FIG. 5, in which an etching mask film pattern 150 is formed on the etching mask film 15.

Next, an etching mask film pattern 150 is formed on the etching mask film 15 as illustrated in FIG. 6 using the resist film 30 on which the resist pattern 300 is formed as a mask. A pattern may be formed on the etching mask film 15 made of a Nb material by dry etching using a chlorine gas as an etching gas.

Figure 7:
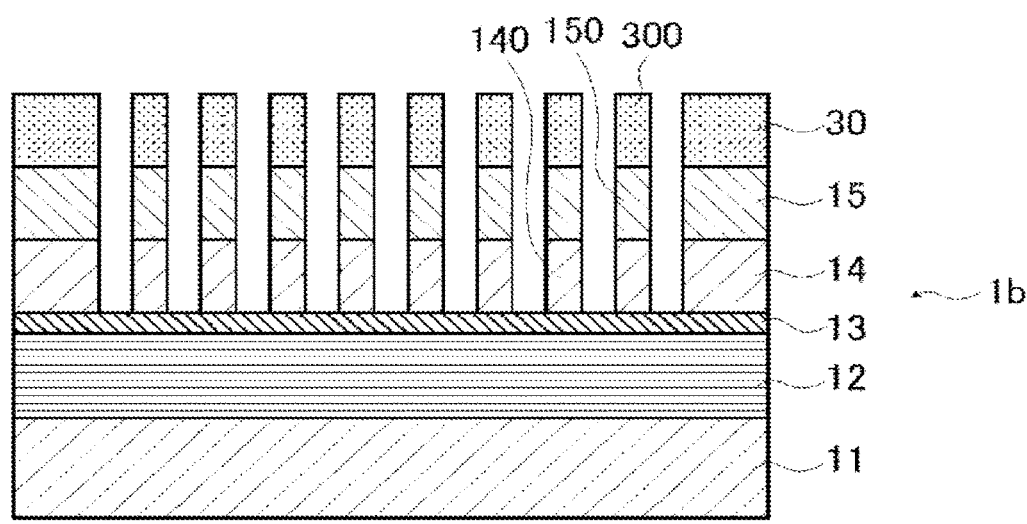
FIG. 7 is a view illustrating a procedure following FIG. 6, in which a phase shift film pattern 140 is formed on a phase shift film 14.

Next, as illustrated in FIG. 7, a phase shift film pattern 140 is formed on the phase shift film 14 using the etching mask film 15 on which the etching mask film pattern 150 is formed as a mask.

A pattern may be formed on the phase shift film 14 containing Ru by dry etching using $O_2$ or a mixed gas of $O_2$ and a halogen gas (chlorine gas or fluorine gas) as an etching gas.

Next, the EUV mask 2 in which the phase shift film pattern 140 is exposed is obtained by removing the resist film 30 and the etching mask film 15 using a cleaning solution containing an acid or a base. Most of the resist pattern 300 and the resist film 30 are removed in a process of forming the phase shift film pattern 140, and in order to remove the resist pattern 300, the resist film 30, and the etching mask film 15 that are remained, cleaning with a cleaning solution containing an acid or a base is performed.

EXAMPLES

The present invention will be described in more detail below using examples, but the present invention is not limited to these examples. Among Examples 1 to 8, Examples 1 to 4 are inventive examples, and Examples 5 to 8 are comparative examples.

Example 1

In Example 1, the EUV mask blank 1a illustrated in FIG. 1 was prepared.

An $SiO_2$—$TiO_2$ glass substrate (outer shape: 6 inches (152 mm) square, thickness: 6.3 mm) was used as the substrate 11 for film formation. The glass substrate had a coefficient of thermal expansion at 20° C. of $0.02\times10^{-7}$/° C., a Young's modulus of 67 GPa, a Poisson's ratio of 0.17, and a specific stiffness of $3.07\times10^7$ m$^2$/s$^2$. This glass substrate was polished to form a smooth surface having a surface roughness (rms) of 0.15 nm or less and a flatness of 100 nm or less.

On a back surface side of the substrate 11, a Cr film having a thickness of 100 nm was formed using a magnetron sputtering method, thereby applying a high dielectric coating having a sheet resistance of 100 Ω/□.

The Si/Mo multilayer reflective film 12 having a total thickness of 272 nm ((4.5 nm+2.3 nm)×40) was formed by fixing the substrate 11 (outer shape: 6 inches (152 mm) square, thickness: 6.3 mm) to a general electrostatic chuck having a flat plate shape via the formed Cr film, and repeating 40 cycles of alternately forming an Si film and an Mo film on the surface of the substrate 11 using an ion beam sputtering method.

Further, the protective film 13 was formed by forming an RuZr film (film thickness: 2.5 nm) on the Si/Mo multilayer reflective film 12 using a DC sputtering method.

Film formation conditions of the Si film, the Mo film and the Ru film were as follows.
(Si Film Formation Conditions)
Target: Si target (boron doped)
Sputtering gas: Ar gas (gas pressure: $2.0\times10^{-2}$ Pa)
Voltage: 700 V
Film formation rate: 0.077 nm/sec
Thickness: 4.5 nm
(Mo Film Formation Conditions)
Target: Mo target
Sputtering gas: Ar gas (gas pressure: $2.0 > 10^{-2}$ Pa)
Voltage: 700 V
Film formation rate: 0.064 nm/sec
Thickness: 2.3 nm
(RuZr Film Formation Conditions)
Target: Ru target
  Zr target
Sputtering gas: Ar gas (gas pressure: $2.0\times10^{-2}$ Pa)
Ru supplied electric power: 500 W
Zr supplied electric power: 150 W
Film formation rate: 0.073 nm/sec
Thickness: 2.5 nm Next, the layer 1 of the phase shift film 14 containing Ru and N was formed on the protective film using a reactive sputtering method. The phase shift film 14 according to the present example includes only the layer 1. The film formation conditions of the layer 1 of the phase shift film 14 were as follows.
(Film Formation Conditions of Layer 1)
Target: Ru target
Sputtering gas: mixed gas of Ar and $N_2$ (Ar: 90.0 vol %, $N_2$: 10.0 vol %, gas pressure: $2.4\times10^{-1}$ Pa)
Supplied electric power density per target area: 6.91 W/cm$^2$
Film formation rate: 0.059 nm/sec
Thickness: 35 nm The following evaluations (1) to (4) were performed on the EUV mask blank 1a obtained by the above procedure. The results were shown in the following table. In the following evaluations (1) to (4), similar evaluation results were obtained even in the case where the layer 1 was formed on a silicon wafer.
(1) Film Stress of Layer 1

The film stress of the layer 1 was evaluated by the following procedure using a stress measurement device after the layer 1 was formed on a 4-inch silicon wafer by the same procedure as described above.

A change in the amount of warpage (radius of curvature) of the substrate before and after film formation was measured by the above measurement device, and the stress of the layer 1 was calculated from the Stoney's equation (following equation).

$$\sigma_A = E_s t_s^2 / 6(1-v_S)R \quad \text{(Stoney's equation)}$$

In the Stoney's equation, $\sigma_A$ is the film stress of the layer 1, $E_s$ is the Young's modulus of the substrate 11, $t_s$ is the thickness of the substrate 11, $v_S$ is the Poisson's ratio of the substrate 11, and R is the radius of curvature of the substrate 11.

The film stress GA obtained by the above procedure is a compressive stress in a case of being a negative value, and is a tensile stress in a case of being a positive value.

(2) Amount of Warpage of EUV Mask Blank

The amount of warpage of the EUV mask blank was measured using a flatness measuring machine. In the case where the amount of warpage is a negative value, a convex warpage occurs on a main surface side of the EUV blank. In the case where the amount of warpage is a positive value, a concave warpage occurs on the main surface side of the EUV mask blank.

(3) Crystal Peak Derived from Layer 1

The layer 1 was measured by an out of plane XRD method. The full width at half maximum FWHM and the diffraction angle 2θ of a diffraction peak attributed to an Ruhcp (002) plane among diffraction peaks derived from the layer 1 were measured.

(4) Surface Roughness of Layer 1

The surface roughness (rms) of the surface of the layer 1 was measured using an atomic force microscope.

(5) Calculation on Phase Difference and Relative Reflectance in EUV Wavelength Region The phase difference between the reflected light of the EUV light from the multilayer reflective film 12 and the reflected light of the EUV light from the phase shift film 14, and the relative reflectance between the EUV light reflectance of the surface of the phase shift film 14 and the EUV light reflectance of the surface of the multilayer reflective film 12 were obtained by optical simulation. As an optical constant of the multilayer reflective film 12 necessary for the simulation, a value in a database of Center for X-Ray Optics, Lawrence Berkeley National Laboratory was used. As an optical constant of the phase shift film 14, a value in the database of Center for X-Ray Optics, Lawrence Berkeley National Laboratory or a value evaluated by measuring an "angle dependency" of a reflectance in a 13.5 nm region was used.

Specifically, the EUV reflectance, the incident angle of EUV light, and the optical constant are expressed by the following equation.

$$R = |(\sin\theta - ((n+ik)^2 - \cos^2\theta)^{1/2})/(\sin\theta + ((n+ik)^2 - \cos^2\theta)^{1/2})|$$

Where θ is the incident angle of EUV light, R is the EUV reflectance at the incident angle θ, n is the refractive index of the phase shift film 14, and k is the extinction coefficient of the phase shift film 14. The EUV optical constants (refractive index (n) and extinction coefficient (k)) can be estimated by fitting the measured values of the reflectance at the respective EUV incident angles using the above equation.

The layer 1 of the phase shift film 14 had a refractive index (n) of 0.884 and an extinction coefficient (k) of 0.017.

The phase difference in the EUV wavelength region was 225 degrees, and the relative reflectance was 22.9%.

(6) $(^{102}Ru^+ + {}^{14}N^+)/{}^{102}Ru^+$ Average Intensity Ratio of Layer 1 Measured by SIMS A secondary ion mass spectrometry (SIMS) was used for the calculation on the $(^{102}Ru^+ + {}^{14}N^+)/{}^{102}Ru^+$ average intensity ratio of the layer 1. Nitrogen (N) is an element which has an extremely low ionization rate and is difficult to analyze with high sensitivity in the SIMS, and as a highly sensitive analysis method of nitrogen (N), a method for measuring a molecular ion in which a main component ion and nitrogen (N) are bonded as a secondary ion (see Reference 1: Japanese Patent No. 3114380) is known. According to the following procedure, the $(^{102}Ru^+ + {}^{14}N^+)/{}^{102}Ru^+$ average intensity ratio of the layer 1 was measured by the SIMS.

(a) First, a sample in which ruthenium (Ru) was formed on a silicon wafer was prepared. At this time, a total of three samples were prepared, that is, a sample in which a film was formed with a volume ratio of nitrogen ($N_2$) of 10% at the time of film formation and a sample in which a film was formed with a volume ratio of nitrogen ($N_2$) of 40% at the time of film formation, in addition to a sample in which ruthenium (Ru) was formed without introducing nitrogen (N).

(b) Next, a sample to be measured and the samples prepared in (a) were simultaneously transferred into a SIMS device, measurement was performed in order, and a depth direction profile of a secondary ion intensity of $^{102}Ru^+$ and a molecular ion $(^{102}Ru^+ + {}^{14}N^+)$ in which nitrogen (N) is bonded to $^{102}Ru^+$ as secondary ions was obtained using an oxygen ion as a primary ion. At this time, a depth direction profile of the secondary ion serving as a main component of an upper layer and a lower layer of the layer 1 or a main component of the substrate is also simultaneously obtained.

For the measurement by the SIMS, ADEPT 1010 (manufactured by ULVAC-PHI Inc.) was used. As measurement conditions of the SIMS, an oxygen ion was used as a primary ion species, and primary ion irradiation was performed at an acceleration voltage of 3 kV, a current value of 50 nA, an incident angle of 45° with respect to a normal line of a sample surface, and a raster size of the primary ion of 400 µm×400 µm.

For the detection on the secondary ion, a detection region was set to 80 µm×80 µm (4% of the raster size of the primary ion), a field aperture of a detector was set to 3, a field axis potential of the measured secondary ion was set to 0, and a secondary ion with positive polarity was detected. At this time, a neutralization gun was used. In order to ensure the measurement accuracy, it is preferable to keep the inside of the device as high vacuum as possible.

A degree of vacuum of a main chamber during this SIMS measurement was about $4.5 \times 10^{-9}$ Torr.

(c) Thereafter, the profile of $(^{102}Ru^+ + {}^{14}N^+)$ was divided by $^{102}Ru^+$ to obtain a depth direction profile of the $(^{102}Ru^+ + {}^{14}N^+)/{}^{102}Ru^+$ intensity ratio. Next, the $(^{102}Ru^+ + {}^{14}N^+)/{}^{102}Ru^+$ average intensity ratio of a region in which the secondary ion intensity of ruthenium (Ru) was horizontally stable was calculated.

At this time, it was confirmed that a magnitude relation among the $(^{102}Ru^+ + {}^{14}N^+)/{}^{102}Ru^+$ average intensity ratio of the sample prepared in (a) in which ruthenium (Ru) was formed without introducing nitrogen (N), the $(^{102}Ru^+ + {}^{14}N^+)/{}^{102}Ru^+$ average intensity ratio of the sample in which a film was formed with the volume ratio of nitrogen ($N_2$) was 10%, and the average intensity ratio of $(^{102}Ru^+ + {}^{14}N^+)/{}^{102}Ru^+$ of the sample in which a film was formed with the volume ratio of nitrogen ($N_2$) was 40% was a relation corresponding to a nitrogen (N) flow rate at the time of film formation.

(d) In the case where the upper layer was present in ruthenium (Ru), a region in which a secondary ion intensity of the main component thereof started to decrease and the secondary ion intensity of ruthenium (Ru) was horizontally stable was set as a calculation region of the average intensity ratio, and in the case where the lower layer was present in ruthenium (Ru), a region in which a secondary ion intensity of the main component thereof started to increase and the secondary ion intensity of ruthenium (Ru) was horizontally stable was set as a calculation region of the average intensity ratio.

In this way, the $(^{102}Ru^+ + ^{14}N^+)/^{102}Ru^+$ average intensity ratio of the layer 1 was measured 3 times for each sample, and an average value was defined as the $(^{102}Ru^+ + ^{14}N^+)/^{102}Ru^+$ average intensity ratio of the layer 1.

Figure 8:
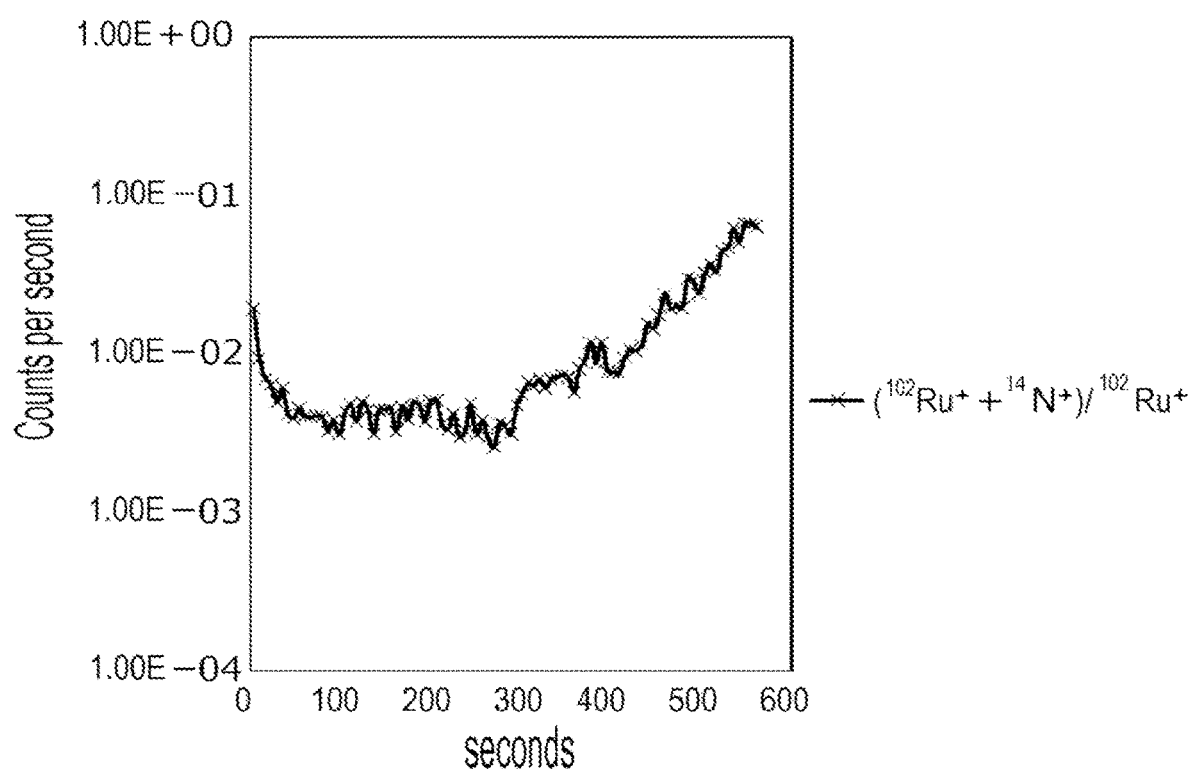
FIG. 8 is a depth direction profile of a ($^{102}$Ru$^+$+$^{14}$N$^+$)/ $^{102}$Ru$^+$ intensity ratio of a layer 1 of the phase shift film 14 according to Example 1 that is measured by secondary ion mass spectrometry (SIMS).

FIG. 8 shows the depth direction profile of the $(^{102}Ru^+ + ^{14}N^+)/^{102}Ru^+$ intensity ratio of the layer 1 of the phase shift film 14 according to Example 1.

According to FIG. 8, regarding the $(^{102}Ru^+ + ^{14}N^+)/^{102}Ru^+$ average intensity ratio of the layer 1 of the phase shift film 14 according to Example 1, a region of 48 seconds to 225 seconds in which the secondary ion intensity is horizontally stable was set as the calculation region of the average intensity ratio.

As a result, the $(^{102}Ru^+ + ^{14}N^+)/^{102}Ru^+$ average intensity ratio of the layer 1 of the phase shift film 14 according to Example 1 was 0.0041.

When N in the layer 1 of the phase shift film 14 according to Example 1 was measured by the XPS, it was a detection lower limit or less (1 at % or less).

Example 2

Example 2 was carried out in the same procedure as Example 1 except that the film formation conditions of the layer 1 of the phase shift film 14 were changed to the following conditions.
(Film Formation Conditions of Layer 1)
  Target: Ru target
  Sputtering gas: mixed gas of Ar, Kr, and $N_2$ (Ar: 58.9 vol %, Kr: 31.1 vol %, $N_2$: 10.0 vol %, gas pressure: $2.4 \times 10^{-1}$ Pa)
  Supplied electric power density per target area: 6.91 $W/cm^2$
  Film formation rate: 0.057 nm/sec
  Thickness: 35 nm
  The layer 1 had a refractive index (n) of 0.887 and an extinction coefficient (k) of
  The phase difference in the EUV wavelength region was 218 degrees, and the relative reflectance was 23.7%.
  The $(^{102}Ru^+ + ^{14}N^+)/^{102}Ru^+$ intensity ratio of the layer 1 was 0.0035.
  When N in the layer 1 was measured by the XPS, it was a detection lower limit or less (1 at % or less).
  The film formation under an inert gas atmosphere containing Kr is preferable because the stress of the layer 1 can be relaxed. Kr may be contained in the layer 1. Kr in the layer 1 can be measured by Rutherford back-scattering spectroscopy (RBS), an electron probe micro analyzer (EPMA), or the like.

Example 3

Example 3 was carried out in the same procedure as Example 1 except that the film formation conditions of the layer 1 of the phase shift film 14 were changed to the following conditions.
(Film Formation Conditions of Layer 1)
  Target: Ru target
  Sputtering gas: mixed gas of Ar, Kr, and $N_2$ (Ar: 38.7 vol %, Kr: 41.6 vol %, $N_2$: 19.7 vol %, gas pressure: $2.4 \times 10^{-1}$ Pa)
  Supplied electric power density per target area: 6.91 $W/cm^2$
  Film formation rate: 0.053 nm/sec
  Thickness: 35 nm
  The layer 1 had a refractive index (n) of 0.890 and an extinction coefficient (k) of 0.017.
  The phase difference in the EUV wavelength region was 212 degrees, and the relative reflectance was 24.7%.
  The $(^{102}Ru^+ + ^{14}N^+)/^{102}Ru^+$ average intensity ratio of the layer 1 was 0.0053.
  When N in the layer 1 was measured by the XPS, it was a detection lower limit or less (1 at % or less).

Example 4

Example 4 was carried out in the same procedure as Example 1 except that the film formation conditions of the layer 1 of the phase shift film 14 were changed to the following conditions.
(Film Formation Conditions of Layer 1)
  Target: Ru target
  Sputtering gas: mixed gas of Ar, Kr, and $N_2$ (Ar: 17.8 vol %, Kr: 42.7 vol %, $N_2$: 39.5 vol %, gas pressure: $2.4 \times 10^{-1}$ Pa)
  Supplied electric power density per target area: 6.91 $W/cm^2$
  Film formation rate: 0.047 nm/sec
  Thickness: 35 nm
  The layer 1 had a refractive index (n) of 0.889 and an extinction coefficient (k) of 0.017.
  The phase difference in the EUV wavelength region was 214 degrees, and the relative reflectance was 24.4%.
  The $(^{102}Ru^+ + ^{14}N^+)/^{102}Ru^+$ average intensity ratio of the layer 1 was 0.0089.
  When N in the layer 1 was measured by the XPS, it was a detection lower limit or less (1 at % or less).

Example 5

Example 5 was carried out in the same procedure as Example 1 except that the film formation conditions of the layer 1 of the phase shift film 14 were changed to the following conditions.
(Film Formation Conditions of Layer 1)
  Target: Ru target
  Sputtering gas: Ar gas (Ar: 100 vol %, gas pressure: $2.4 \times 10^{-1}$ Pa)
  Supplied electric power density per target area: 6.91 $W/cm^2$
  Film formation rate: 0.058 nm/sec
  Thickness: 35 nm
  The layer 1 had a refractive index (n) of 0.886 and an extinction coefficient (k) of 0.017.
  The phase difference in the EUV wavelength region was 221 degrees, and the relative reflectance was 23.3%.
  The $(^{102}Ru^+ + ^{14}N^+)/^{102}Ru^+$ average intensity ratio of the layer 1 was 0.0025, which was a background level.
  When N in the layer 1 was measured by the XPS, it was a detection lower limit or less (1 at % or less).

Example 6

Example 6 was carried out in the same procedure as Example 1 except that the film formation conditions of the layer 1 of the phase shift film 14 were changed to the following conditions.
(Film Formation Conditions of Layer 1)
  Target: Ru target
  Sputtering gas: mixed gas of Ar and $N_2$ (Ar: 80.0 vol %, $N_2$: 20.0 vol %, gas pressure: $2.4 \times 10^{-1}$ Pa)

Supplied electric power density per target area: 6.91 W/cm²
Film formation rate: 0.055 nm/sec
Thickness: 35 nm
The layer 1 had a refractive index (n) of 0.885 and an extinction coefficient (k) of 0.017.
The phase difference in the EUV wavelength region was 223 degrees, and the relative reflectance was 23.1%.
The ($^{102}$Ru$^+$+$^{14}$N$^+$)/$^{102}$Ru$^+$ average intensity ratio of the layer 1 was 0.0060.

The layer 1 had a refractive index (n) of 0.890 and an extinction coefficient (k) of 0.017.
The phase difference in the EUV wavelength region was 212 degrees, and the relative reflectance was 24.9%.
The ($^{102}$Ru$^+$+$^{14}$N$^+$)/$^{102}$Ru$^+$ average intensity ratio of the layer 1 was 0.0025, which was the background level.
When N in the layer 1 was measured by the XPS, it was a detection lower limit or less (1 at % or less).

TABLE 1

| | Sputtering gas | | | Film formation rate (nm/sec) | Film stress (MPa) | Amount of warpage (nm) | RMS (nm) | Ruhcp (002) | |
|---|---|---|---|---|---|---|---|---|---|
| | Ar (vol %) | Kr (vol %) | N₂ (vol %) | | | | | 2θ (deg) | FMHW (deg) |
| Example 1 | 90.0 | 0.0 | 10.0 | 0.059 | −720 | −232 | 0.28 | 41.67 | 0.67 |
| Example 2 | 58.9 | 31.1 | 10.0 | 0.057 | −121 | −39 | 0.41 | 41.74 | 0.67 |
| Example 3 | 38.7 | 41.6 | 19.7 | 0.053 | 3 | 1 | 0.40 | 41.51 | 0.70 |
| Example 4 | 17.8 | 42.7 | 39.5 | 0.047 | −543 | −175 | 0.43 | 40.96 | 0.88 |
| Example 5 | 100.0 | 0.0 | 0.0 | 0.058 | −2212 | −714 | 0.32 | 42.05 | 0.40 |
| Example 6 | 80.0 | 0.0 | 20.0 | 0.055 | −1200 | −387 | 0.27 | 41.17 | 1.09 |
| Example 7 | 60.0 | 0.0 | 40.0 | 0.046 | −2430 | −784 | 0.25 | 40.74 | 1.06 |
| Example 8 | 0.0 | 100.0 | 0.0 | 0.059 | −2012 | 649 | 1.03 | 42.30 | 0.49 |

When N in the layer 1 was measured by the XPS, it was a detection lower limit or less (1 at % or less).

Example 7

Example 7 was carried out in the same procedure as Example 1 except that the film formation conditions of the layer 1 of the phase shift film 14 were changed to the following conditions.
(Film Formation Conditions of Layer 1)
  Target: Ru target
  Sputtering gas: mixed gas of Ar and N₂ (Ar: 60.0 vol %, N₂: 40.0 vol %, gas pressure: 2.4×10⁻¹ Pa)
  Supplied electric power density per target area: 6.91 W/cm²
  Film formation rate: 0.046 nm/sec
  Thickness: 35 nm
The layer 1 had a refractive index (n) of 0.888 and an extinction coefficient (k) of 0.017.
The phase difference in the EUV wavelength region was 216 degrees, and the relative reflectance was 24.2%.
The ($^{102}$Ru$^+$+$^{14}$N$^+$)/$^{102}$Ru$^+$ average intensity ratio of the layer 1 was 0.0100.
When N in the layer 1 was measured by the XPS, it was a detection lower limit or less (1 at % or less).

Example 8

Example 8 was carried out in the same procedure as Example 1 except that the film formation conditions of the layer 1 of the phase shift film 14 were changed to the following conditions.
(Film Formation Conditions of Layer 1)
  Target: Ru target
  Sputtering gas: Kr gas (Kr: 100.0 vol %, gas pressure: 2.4×10⁻¹ Pa)
  Supplied electric power density per target area: 6.91 W/cm²
  Film formation rate: 0.059 nm/sec
  Thickness: 35 nm In each of Examples 1 to 4 in which an absolute value of the film stress of the layer 1 was 1,000 MPa or less, the warpage of the EUV mask blank was prevented, and the amount of warpage was 300 nm or less.
In each of Examples 5 to 8 in which the absolute value of the film stress of the layer 1 exceeded 1,000 MPa, the warpage of the EUV mask blank was large, and the amount of warpage exceeded 300 nm.
In each of Examples 1 to 4, among diffraction peaks derived from the layer 1 observed by the out of plane XRD method, the full width at half maximum FWHM of a diffraction peak attributed to the Ruhcp (002) plane was 0.5° or more, the diffraction angle 2θ was 42° or less, and the crystallization of the layer 1 was prevented. Accordingly, the smoothness of the surface of the phase shift film 14 was high, and the surface roughness (rms) of the surface of the phase shift film 14 was 0.50 nm or less.
In each of Examples 2 to 4, the stress of the layer 1 can be relaxed by forming the layer 1 under the Kr atmosphere. The layer 1 is presumed to contain a small amount of Kr.

Example 9

Example 9 was carried out by the same procedure as Example 3 except that the phase shift film 14 in which a layer 1 containing Ru and N and a layer 2 containing Ta, O and N were laminated in this order was formed using a reactive sputtering method.
(Film Formation Conditions of Layer 1)
  Target: Ru target
  Sputtering gas: mixed gas of Ar, Kr, and N₂ (Ar: 38.7 vol %, Kr: 41.6 vol %, N₂: 19.7 vol %, gas pressure: 2.4×10⁻¹ Pa)
  Supplied electric power density per target area: 6.91 W/cm²
  Film formation rate: 0.053 nm/sec
  Thickness: 30 nm The film stress of the layer 1 was +3 MPa.
A total stress (MPa·nm), which is an absolute value of a product of the thickness of the layer 1 and the film stress of the layer 1, was 90 MPa·nm.

The layer 1 had a refractive index (n) of 0.890 and an extinction coefficient (k) of 0.017.

The phase difference in the EUV wavelength region was 212 degrees, and the relative reflectance was 24.7%.

The $(^{102}Ru^+ + ^{14}N^+)/^{102}Ru^+$ average intensity ratio of the layer 1 was 0.0053.

(Film Formation Conditions of Layer 2)
  Target: Ta Target
  Sputtering gas: mixed gas of Ar, $O_2$, and $N_2$ (Ar: 50 vol %, $O_2$: 40 vol %, $N_2$: 10 vol %, gas pressure: $2.0 \times 10^{-1}$ Pa)
  Supplied electric power density per target area: 7.40 W/cm$^2$
  Film formation rate: 0.028 nm/sec
  Thickness: 15 nm
  A film stress of the layer 2 was −375 MPa.

A total stress (MPa·nm), which is an absolute value of a product of the thickness of the layer 2 and the film stress of the layer 2, was 5,625 MPa·nm.

The layer 2 had a refractive index (n) of 0.890 and an extinction coefficient (k) of 0.017.

The phase shift film 14 had a phase difference of 212 degrees in the EUV wavelength region and a relative reflectance of 24.7%.

The warpage of the EUV mask blank was −51 nm.

A sum of the total stresses of the layer 1 and the layer 2 was preferably 35,000 MPa·nm or less, and was 5,715 MPa·nm in Example 9, which leads to prevention of the warpage of the EUV mask blank.

Example 10

Example 10 was carried out in the same procedure as Example 3 except that the phase shift film 14 in which a layer 1 containing Ru and N, and a layer containing Ta and N (TaN layer) and a layer containing Ta, O, and N (TaON layer) as a layer 2 were laminated in this order was formed using a reactive sputtering method.

(Film Formation Conditions of Layer 1)
  Target: Ru target
  Sputtering gas: mixed gas of Ar, Kr, and $N_2$ (Ar: 38.7 vol %, Kr: 41.6 vol %, $N_2$: 19.7 vol %, gas pressure: $2.4 \times 10^{-1}$ Pa)
  Supplied electric power density per target area: 6.91 W/cm$^2$
  Film formation rate: 0.053 nm/sec
  Thickness: 30 nm
  The film stress of the layer 1 was +3 MPa.

A total stress (MPa·nm), which is an absolute value of a product of the thickness of the layer 1 and the film stress of the layer 1, was 90 MPa·nm.

The layer 1 had a refractive index (n) of 0.890 and an extinction coefficient (k) of 0.017.

The phase difference in the EUV wavelength region was 212 degrees, and the relative reflectance was 24.7%.

The $(^{102}Ru^+ + ^{14}N^+)/^{102}Ru^+$ average intensity ratio of the layer 1 was 0.0053.

(Film Formation Conditions of Layer 2 (TaN Layer))
  Target: Ta Target
  Sputtering gas: mixed gas of Ar and $N_2$ (Ar: 72 vol %, $N_2$: 28 vol %, gas pressure: $2.0 \times 10^{-1}$ Pa)
  Supplied electric power density per target area: 8.3 W/cm$^2$
  Film formation rate: 0.04 nm/sec
  Thickness: 10 nm
  In the layer 2, the film stress of the TaN layer was −2,000 MPa.

In the layer 2, the TaN layer had a refractive index (n) of 0.948 and an extinction coefficient (k) of 0.033.

The total stress (MPa·nm), which is an absolute value of a product of the thickness of the TaN layer of the layer 2 and the film stress of the TaN layer of the layer 2, was 20,000 MPa·nm.

(Film Formation Conditions of Layer 2 (TaON Layer))
  Target: Ta Target
  Sputtering gas: mixed gas of Ar, $O_2$, and $N_2$ (Ar: 50 vol %, $O_2$: 40 vol %, $N_2$: 10 vol %, gas pressure: $2.0 \times 10^{-1}$ Pa)
  Supplied electric power density per target area: 7.40 W/cm$^2$
  Film formation rate: 0.028 nm/sec
  Thickness: 5 nm
  In the layer 2, the film stress of the TaON layer was −375 MPa.

The total stress (MPa·nm), which is an absolute value of a product of the thickness of the TaON layer of the layer 2 and the film stress of the TaON layer of the layer 2, was 1,875 MPa·nm.

In the layer 2, the TaON layer had a refractive index (n) of 0.890 and an extinction coefficient (k) of 0.017.

The phase shift film 14 had a phase difference of 218 degrees in the EUV wavelength region and a relative reflectance of 17.4%.

The warpage of the EUV mask blank was −293 nm.

A sum of the total stresses of the layer 1 and the layer 2 (TaN layer, TaON layer) was preferably 35,000 MPa·nm or less, and was 21,965 MPa·nm in Example 10, which leads to prevention of the warpage of the EUV mask blank.

Example 11

Example 11 was carried out in the same procedure as in Example 3 except that the phase shift film 14 in which a layer 2 containing Cr and N and a layer 1 containing Ru and N were laminated in this order was formed using a reactive sputtering method.

(Film Formation Conditions of Layer 2)
  Target: Cr Target
  Sputtering gas: mixed gas of Ar and $N_2$ (Ar: 80 vol %, $N_2$: 20 vol %, gas pressure: $2.0 > 10^{-1}$ Pa)
  Supplied electric power density per target area: 9.9 W/cm$^2$
  Film formation rate: 0.09 nm/sec
  Thickness: 10 nm
  The film stress of the layer 2 was −300 MPa.

The total stress (MPa·nm), which is an absolute value of a product of the thickness of the layer 2 and the film stress of the layer 2, was 3,000 MPa·nm.

The layer 2 had a refractive index (n) of 0.922 and an extinction coefficient (k) of 0.039.

(Film Formation Conditions of Layer 1)
  Target: Ru target
  Sputtering gas: mixed gas of Ar, Kr, and $N_2$ (Ar: 38.7 vol %, Kr: 41.6 vol %, $N_2$: 19.7 vol %, gas pressure: $2.4 \times 10^{-1}$ Pa)
  Supplied electric power density per target area: 6.91 W/cm$^2$
  Film formation rate: 0.053 nm/sec
  Thickness: 30 nm
  The film stress of the layer 1 was +3 MPa.

A total stress (MPa·nm), which is an absolute value of a product of the thickness of the layer 1 and the film stress of the layer 1, was 90 MPa·nm.

The layer 1 had a refractive index (n) of 0.890 and an extinction coefficient (k) of 0.017.

The phase difference in the EUV wavelength region was 212 degrees, and the relative reflectance was 24.7%.

The ($^{102}$Ru$^+$+$^{14}$N$^+$)/$^{102}$Ru$^+$ average intensity ratio of the layer 1 was 0.0053.

The phase shift film 14 had a phase difference of 230 degrees in the EUV wavelength region and a relative reflectance of 17.6%.

The warpage of the EUV mask blank was −24 nm.

A sum of the total stresses of the layer 1 and the layer 2 was preferably 35,000 MPa·nm or less, and was 3,090 MPa·nm in Example 11, which leads to prevention of warpage of the EUV mask blank.

Although various embodiments have been described above with reference to the drawings, it is needless to say that the present invention is not limited to such examples. It is obvious for a person skilled in the art that various modifications and variations can be made within the category described in the scope of claims and it is understood that such modifications and variations naturally belong to the technical scope of the present invention. Further, the components described in the above embodiments may be combined in any manner without departing from the spirit of the invention.

The present application is based on a Japanese patent application (JP2021-022583A) filed Feb. 16, 2021, the contents of which are incorporated herein by reference.

REFERENCE SIGNS LIST 1a, 1b: EUV mask blank
2: EUV mask
11: substrate
12: multilayer reflective film
13: protective film
14: phase shift film
15: etching mask film
30: resist film
140: phase shift film pattern
150: etching mask film pattern
300: resist pattern

What is claimed is:

1. A reflective mask blank for EUV lithography, comprising:
   a substrate,
   a multilayer reflective film reflecting EUV light, and
   a phase shift film shifting a phase of the EUV light,
   wherein the substrate, the multilayer reflective film, and the phase shift film are formed in this order,
   the phase shift film comprises a layer 1 comprising ruthenium (Ru) and nitrogen (N), and
   the layer 1 has an absolute value of a film stress of 1,000 MPa or less.

2. The reflective mask blank for EUV lithography according to claim 1, wherein a full width at half maximum FWHM of a diffraction peak attributed to an Ruhcp (002) plane among diffraction peaks derived from the layer 1 by an out of plane XRD method is 0.5° or more.

3. The reflective mask blank for EUV lithography according to claim 1, wherein a diffraction angle 2θ of a diffraction peak attributed to an Ruhcp (002) plane among diffraction peaks derived from the layer 1 by an out of plane XRD method is 42° or less.

4. The reflective mask blank for EUV lithography according to claim 1, wherein a ($^{102}$Ru$^+$+$^{14}$N$^+$)/$^{102}$Ru$^+$ average intensity ratio of the layer 1 measured by secondary ion mass spectrometry is 0.0030 or more and 0.020 or less.

5. The reflective mask blank for EUV lithography according to claim 1, wherein the phase shift film further comprises a layer 2 comprising at least one element (X) selected from the group consisting of chromium (Cr), tantalum (Ta), titanium (Ti), rhenium (Re), tungsten (W), bismuth (Bi), manganese (Mn), platinum (Pt), copper (Cu), iridium (Ir), and vanadium (V).

6. The reflective mask blank for EUV lithography according to claim 5, wherein the layer 2 further comprises at least one element selected from the group consisting of oxygen (O), N, boron (B), and carbon (C).

7. The reflective mask blank for EUV lithography according to claim 5, wherein the layer 2 further comprises Ru and at least one of O and N.

8. The reflective mask blank for EUV lithography according to claim 1, wherein the phase shift film has a thickness of 20 nm to 60 nm.

9. The reflective mask blank for EUV lithography according to claim 1, wherein a phase difference between reflected light of the EUV light from the multilayer reflective film and reflected light of the EUV light from the phase shift film is 150 degrees to 250 degrees, and
   a relative reflectance between an EUV light reflectance of a surface of the phase shift film and an EUV light reflectance of a surface of the multilayer reflective film ((EUV light reflectance of surface of phase shift film/EUV light reflectance of surface of multilayer reflective film)×100) is 2% to 37%.

10. The reflective mask blank for EUV lithography according to claim 1, wherein a protective film for the multilayer reflective film is formed between the multilayer reflective film and the phase shift film.

11. The reflective mask blank for EUV lithography according to claim 10, wherein the protective film comprises at least one element selected from the group consisting of Ru, palladium (Pd), Ir, rhodium (Rh), Pt, zirconium (Zr), niobium (Nb), Ta, Ti, and silicon (Si).

12. The reflective mask blank for EUV lithography according to claim 11, wherein the protective film further comprises at least one element selected from the group consisting of O, N, and B.

13. The reflective mask blank for EUV lithography according to claim 1, further comprising an etching mask film on the phase shift film, the etching mask film comprising at least one element selected from the group consisting of Nb, Ti, Mo, Ta, and Si.

14. The reflective mask blank for EUV lithography according to claim 13, wherein the etching mask film further comprises at least one element selected from the group consisting of O, N, and B.

15. A reflective mask for EUV lithography, comprising a pattern formed on the phase shift film of the reflective mask blank for EUV lithography according to claim 1.

16. A method for manufacturing a reflective mask blank for EUV lithography, the method comprising:
   forming a multilayer reflective film reflecting EUV light on or above a substrate; and
   forming a phase shift film shifting a phase of the EUV light on or above the multilayer reflective film,
   wherein the phase shift film comprises a layer 1 comprising Ru and N, and
   the layer 1 is formed by performing a reactive sputtering method using a target comprising Ru in an inert gas atmosphere comprising argon (Ar) and $N_2$ and having a volume ratio of $N_2$ of 1 vol % to 40 vol %.

17. A method for manufacturing a reflective mask blank for EUV lithography, the method comprising:
- forming a multilayer reflective film reflecting EUV light on or above a substrate; and
- forming a phase shift film shifting a phase of the EUV light on or above the multilayer reflective film,
- wherein the phase shift film comprises a layer 1 comprising Ru and N, and
- the layer 1 is formed by performing a reactive sputtering method using a target comprising Ru in an inert gas atmosphere comprising Ar, krypton (Kr), and $N_2$ and having a volume ratio of $N_2$ of 1 vol % to 40 vol %.

18. A method for manufacturing a reflective mask for EUV lithography, the method comprising patterning a phase shift film of a reflective mask blank for EUV lithography manufactured by the method for manufacturing a reflective mask blank for EUV lithography according to claim 16 to form a pattern.

* * * * *